United States Patent
Lee

(10) Patent No.: US 9,761,313 B2
(45) Date of Patent: Sep. 12, 2017

(54) NON-VOLATILE SEMICONDUCTOR MEMORY DEVICE WITH MULTIPLE PASS VOLTAGE AND IMPROVED VERIFICATION AND PROGRAMMING OPERATING METHOD THEREOF

(71) Applicant: SK hynix Inc., Icheon-si Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/431,442

(22) Filed: Feb. 13, 2017

(65) Prior Publication Data

US 2017/0154680 A1  Jun. 1, 2017

Related U.S. Application Data

(63) Continuation-in-part of application No. 14/841,902, filed on Sep. 1, 2015, now Pat. No. 9,646,701.

(30) Foreign Application Priority Data

Apr. 9, 2015 (KR) .......................... 10-2015-0050313

(51) Int. Cl.
*G11C 16/10* (2006.01)
*G11C 16/04* (2006.01)
(Continued)

(52) U.S. Cl.
CPC .......... *G11C 16/10* (2013.01); *G11C 11/5628* (2013.01); *G11C 16/0483* (2013.01); *G11C 16/3427* (2013.01); *G11C 16/3459* (2013.01)

(58) Field of Classification Search
CPC . G11C 16/10; G11C 16/0483; G11C 16/3459; G11C 11/5621; G11C 11/5628
See application file for complete search history.

(56) References Cited

U.S. PATENT DOCUMENTS 5,862,074 A     1/1999 Park
2002/0126532 A1  9/2002 Matsunaga et al.
(Continued)

FOREIGN PATENT DOCUMENTS

KR  1020090036839 A  4/2009
KR  1020140073815 A  6/2014

*Primary Examiner* — Harry W Byrne
*Assistant Examiner* — Ajay Ojha
(74) *Attorney, Agent, or Firm* — William Park & Associates Ltd.

(57) ABSTRACT

A semiconductor memory device may include a memory cell array including a plurality of cell strings, a peripheral circuit unit configured to perform a program loop for alternately performing a program operation and a verification operation on the memory cell array, and a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation, wherein a potential level of the first pass voltage is adjusted in accordance with an arrangement position of each of the plurality of word lines and the plurality of word lines are defined as a plurality of groups, and the first pass voltages applied to the plurality of groups, respectively, are different from one another.

12 Claims, 10 Drawing Sheets

(51) Int. Cl.
*G11C 16/34* (2006.01)
*G11C 11/56* (2006.01)

(56) References Cited

U.S. PATENT DOCUMENTS

| | | |
|---|---|---|
| 2008/0089130 A1 | 4/2008 | Park |
| 2010/0110793 A1 | 5/2010 | Kim et al. |
| 2010/0302853 A1 | 12/2010 | Wang |
| 2011/0019486 A1* | 1/2011 | Jang .................. G11C 16/0483 |
| | | 365/185.25 |
| 2014/0112075 A1 | 4/2014 | Dunga et al. |
| 2016/0055914 A1* | 2/2016 | Nam ..................... G11C 16/10 |
| | | 365/185.25 |

* cited by examiner

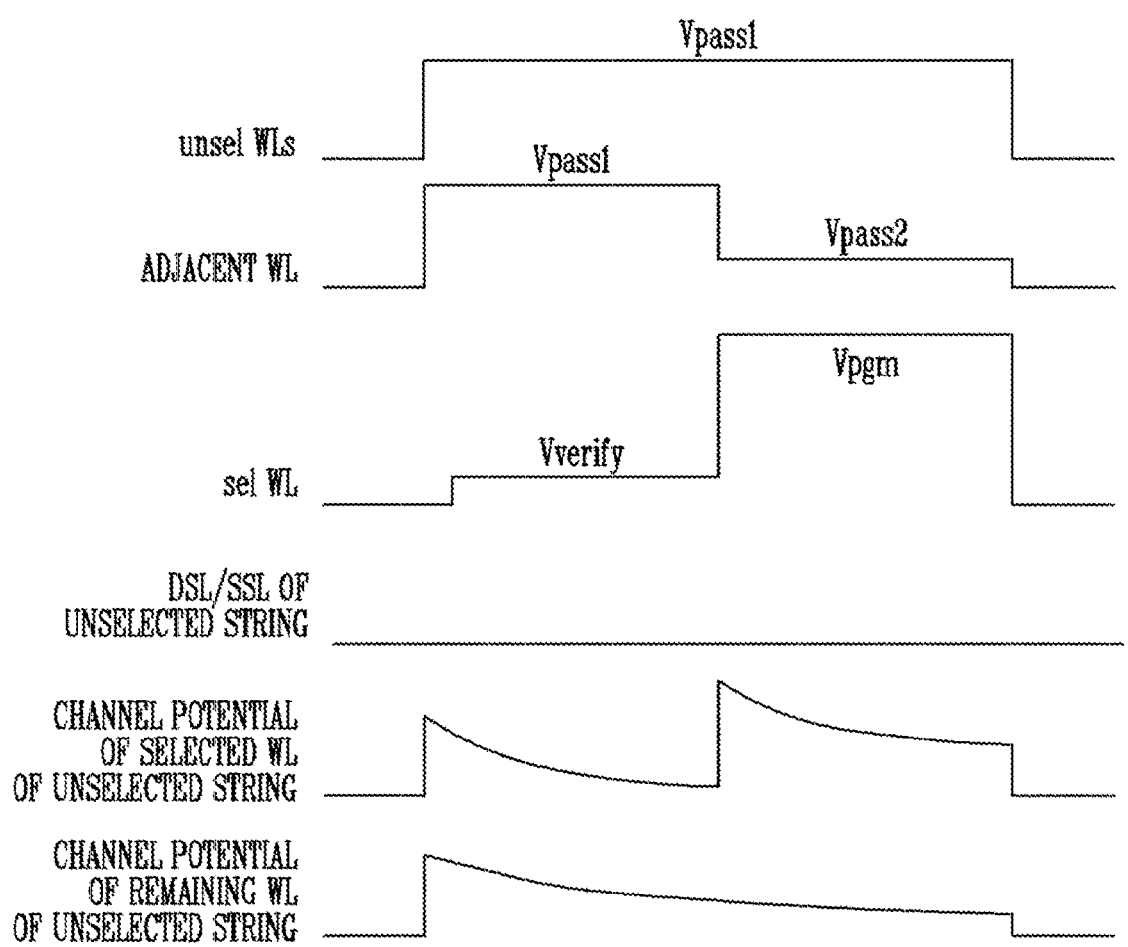

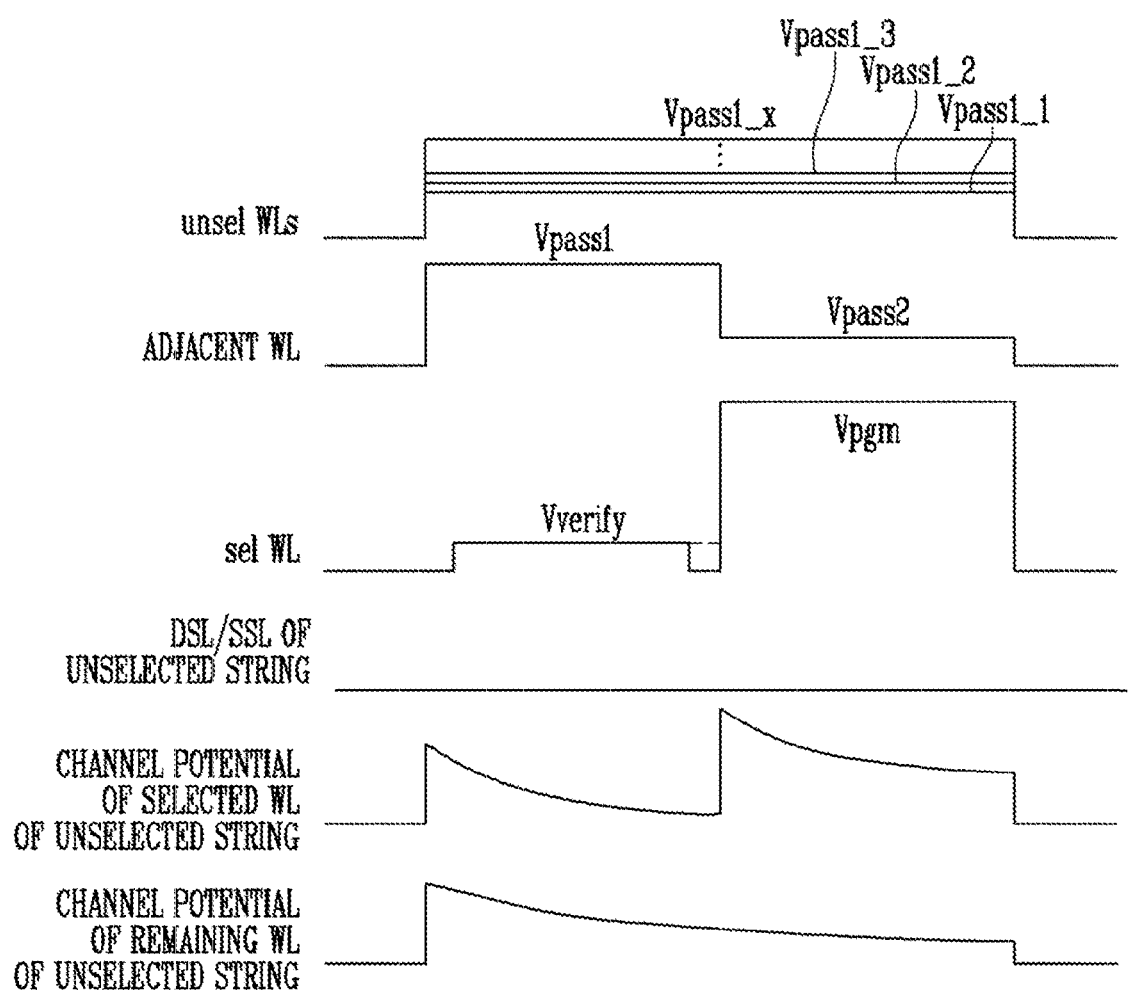

NON-VOLATILE SEMICONDUCTOR MEMORY DEVICE WITH MULTIPLE PASS VOLTAGE AND IMPROVED VERIFICATION AND PROGRAMMING OPERATING METHOD THEREOF

CROSS-REFERENCE TO RELATED APPLICATION

This application is a Continuation in Part of U.S. patent application Ser. No. 14/841,902 filed on Sep. 1, 2015 which claims priority to and the benefit of Korean Patent Application No. 10-2015-0050313, filed on Apr. 9, 2015, the disclosure of which is incorporated herein by reference in its entirety.

BACKGROUND

1. Technical Field

Various embodiments generally relate to an electronic device, and more particularly, to a semiconductor memory device and an operating method thereof.

2. Related Art

Semiconductor memory devices are generally classified as a volatile memory device or a nonvolatile memory device.

The nonvolatile memory device has a relatively low write and read rate, but maintains stored data even after a power supply is cut off. Accordingly, the nonvolatile memory device is used in order to store data needing to be maintained regardless of the power supply. Nonvolatile memory devices may include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. Flash memory is generally divided between a NOR type and a NAND type of flash memory.

The RAM of flash memory gives the flash memory the advantages of freely programming and erasing data. The ROM of flash memory gives the flash memory the advantages of maintaining stored data even though a power supply is cut off. The flash memory is widely used as a storage medium of a portable electronic device, such as a digital camera, a Personal Digital Assistant (PDA), and an MP3 player.

SUMMARY

In an embodiment, a semiconductor memory device may be provided. The semiconductor memory device may include a memory cell array including a plurality of cell strings, and a peripheral circuit. The peripheral circuit may include a voltage generating unit configured to perform a program loop for alternately performing a program operation and a verification operation on the memory cell array. The peripheral circuit may include a control logic configured to control the voltage generating unit to perform the program loop. Wherein, in performing the program loop, a second pass voltage applied to an unselected word line adjacent to a selected word line among a plurality of word lines connected with the memory cell array is lower than a first pass voltage applied to a remaining unselected word line during the program operation.

In an embodiment, a method of operating a semiconductor memory device may be provided. The method may include applying a program voltage to a selected word line among a plurality of word lines connected with a plurality of cell strings while performing a program operation. The method may include applying a second pass voltage to first unselected word lines adjacent to the selected word line while performing the program operation, and applying a first pass voltage higher than the second pass voltage to second unselected word lines except for the first selected word lines among a plurality of unselected word lines while performing the program operation. The method may include discharging the program voltage and then applying a verification voltage to the selected word line while performing a verification operation, and applying the first pass voltage to the first unselected word lines and the second unselected word lines while performing the verification operation.

In an embodiment, a method of operating a semiconductor memory device may be provided. The method may include applying a program voltage to a selected word line among a plurality of word lines connected with a plurality of cell strings while performing a program operation. The method may include applying a second pass voltage to first unselected word lines adjacent to the selected word line while performing the program operation, and applying a first pass voltage higher than the second pass voltage to second unselected word lines except for the first unselected word lines among a plurality of unselected word lines while performing the program operation. The method may include applying a verification voltage to the selected word line while performing a verification operation, and applying the first pass voltage to the first unselected word lines and the second unselected word lines while performing the verification operation, in which program voltage and the verification voltage are continuously applied to the selected word line without allowing a discharge operation.

In an embodiment, a semiconductor memory device may be provided. The semiconductor memory device may include a memory cell array including a plurality of cell strings, a peripheral circuit unit configured to perform a program loop for alternately performing a program operation and a verification operation on the memory cell array, and a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation, wherein a potential level of the first pass voltage is adjusted in accordance with an arrangement position of each of the plurality of word lines.

In an embodiment, a semiconductor memory device may be provided. The semiconductor memory device may include a memory cell array including a plurality of cell strings, a peripheral circuit unit configured to perform a program loop for alternately performing a program operation and a verification operation on the memory cell array, and a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation, wherein the plurality of word lines are defined as a plurality of groups, and the first pass voltages applied to the plurality of groups, respectively, are different from one another.

BRIEF DESCRIPTION OF THE DRAWINGS

FIG. 6 is a waveform diagram of representations of examples of signals for describing program and verification operations of a semiconductor memory device according to an embodiment.

FIG. 8 is a waveform diagram of representations of examples of signals for describing program and verification operations of a semiconductor memory device according to another embodiment.

DETAILED DESCRIPTION

Various advantages and features of the present invention and methods accomplishing thereof will become apparent from the following description of embodiments with reference to the accompanying drawings. However, the present invention is not limited to the exemplary embodiments described herein, and may be specified in other forms. However, the present exemplary embodiments are provided for describing the present invention in detail so that those skilled in the art may easily work the technical spirit of the present invention.

Throughout this specification and the claims that follow, when it is described that an element is "coupled" to another element, the element may be "directly coupled" to the other element or "electrically coupled" to the other element through a third element. Throughout the specification and the claims, unless explicitly described to the contrary, the word "comprise" and variations such as "comprises" or "comprising" will be understood to imply the inclusion of stated elements but not the exclusion of any other elements.

Various embodiments may provide a semiconductor memory device. The semiconductor memory device may be capable of suppressing a program disturbance phenomenon during a program operation and a read disturbance phenomenon during a verification operation of the semiconductor memory device. Various embodiments may provide an operating method of the semiconductor memory device.

According to the various embodiments, it may be possible to suppress a program disturbance phenomenon during a program operation and a read disturbance phenomenon during a verification operation of the semiconductor memory device, decrease an entire time of the program operation, and decrease power consumption.

Figure 1:
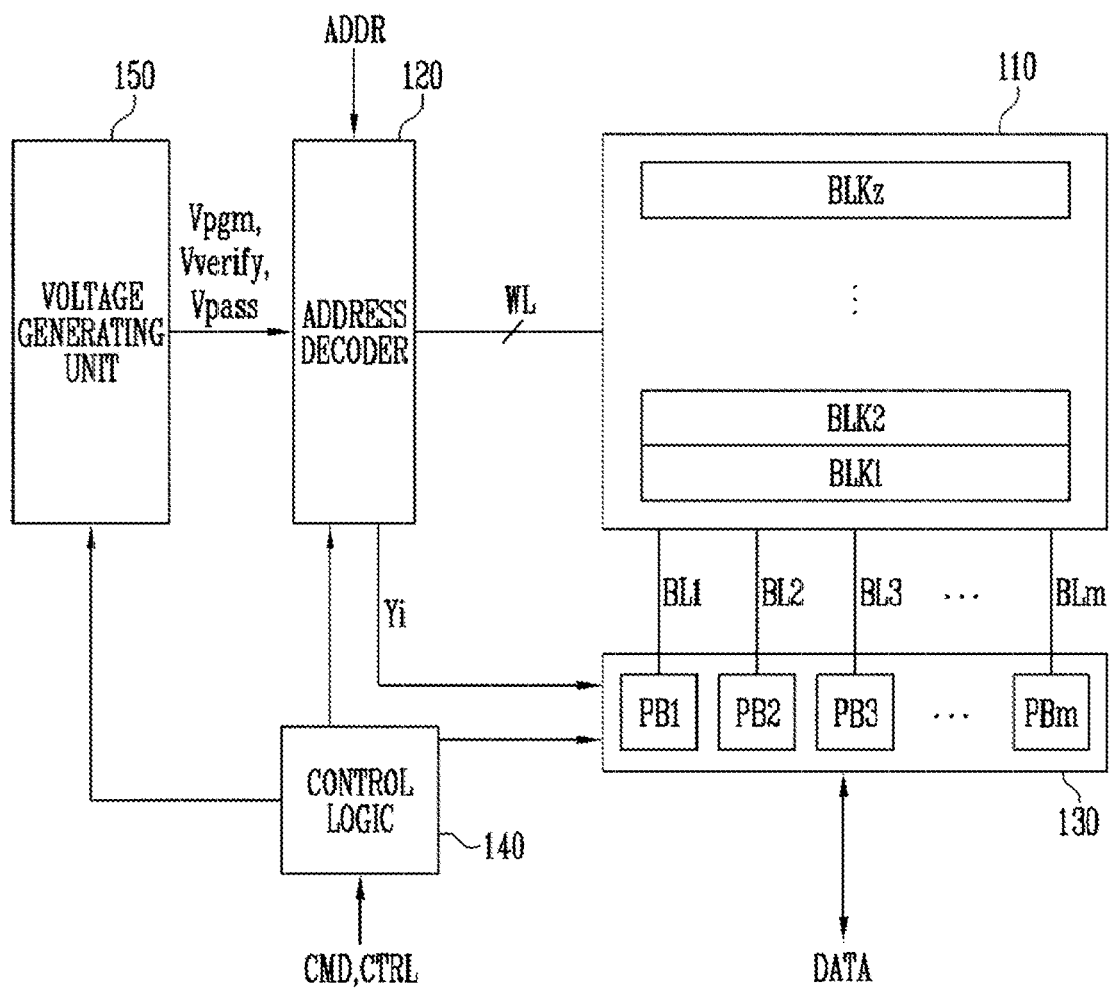
FIG. 1 is a representation of an example of a block diagram for describing a representation of an example of a semiconductor memory device according to an embodiment.

FIG. 1 is a block diagram for describing a representation of an example of a semiconductor memory device according to an embodiment.

Referring to FIG. 1, a semiconductor memory device 100 may include a memory cell array 110, an address decoder 120, and a read and write circuit 130. The semiconductor memory device 100 may include a control logic 140, and a voltage generating unit 150.

The memory cell array 110 may include a plurality of memory blocks BLK1 to BLKz. The plurality of memory blocks BLK1 to BLKz may be connected to the address decoder 120 through word lines WL. The plurality of memory blocks BLK1 to BLKz may be connected to the read and write circuit 130 through bit lines BL1 to BLm. Each of the plurality of memory blocks BLK1 to BLKz may include a plurality of memory cells. As an example of an embodiment, the plurality of memory cells may be nonvolatile memory cells. In the plurality of memory cells, the memory cells connected to the same word line may be defined as one page. The memory cell array 110 may be formed of a plurality of pages.

Each of the plurality of memory blocks BLK1 to BLKz of the memory cell array 110 may include a plurality of cell strings. Each of the plurality of cell strings may include a drain selection transistor, a plurality of drain side memory cells, a pipe transistor, a plurality of source side memory cells, and a source selection transistor, which are serially connected between the bit line and the source line. The memory cell block 110 will be described below.

The address decoder 120, the read and write circuit 130, and the voltage generating unit 150 may be operated as peripheral circuits driving the memory cell array 110.

The address decoder 120 may be connected to the memory cell array 110 through the word lines WL. The address decoder 120 may be configured to be operated in response to a control by the control logic 140. The address decoder 120 may receive an address ADDR through an input/output buffer (not illustrated) inside the semiconductor memory device 100.

The address decoder 120 may decode a row address among the addresses ADDR, in which a program voltage Vpgm, a pass voltage Vpass, and a plurality of operating voltages generated by the voltage generating unit 150 are received, during a program operation, and may apply the voltages to the plurality of drain side memory cells, the source side memory cells, the source selection transistor, and the pipe transistor of the memory cell array 110 according to the decoded row address. The address decoder 120 may decode a row address among the addresses ADDR, in which a verification voltage Vverify, a pass voltage Vpass, and a plurality of operating voltages generated by the voltage generating unit 150 are received, during a program verification operation, and may apply the voltages to the plurality of drain side memory cells, the source side memory cells, the source selection transistor, and the pipe transistor of the memory cell array 110 according to the decoded row address. The address decoder 120 may apply the pass voltage Vpass to unselected word lines among the plurality of word lines during the program operation and the verification operation. The address decoder 120 may prevent a potential level of the unselected word line from being discharged by continuously applying the pass voltage Vpass in a section, in which the verification operation is switched to the program operation. The pass voltage applied to the unselected word lines adjacent to the selected word line among the unselected word lines may be a pass voltage Vpass having a lower potential level than that of the pass voltage Vpass applied to the unselected word line. When the address decoder 120 applies the verification voltage Vverify to the selected word line, and then applies the program voltage Vpgm to the selected word line by switching the verification operation to the program operation, the address decoder 120 may apply the program voltage Vpgm without a discharge operation of the selected word line. For example, the address decoder 120 may apply the verification voltage Vverify to the selected word line, and then apply the program voltage Vpgm without a discharge section.

The address decoder 120 may be configured to decode a column address among the received addresses ADDR. The address decoder 120 may transmit the decoded column address Yi to the read and write circuit 130.

The program operation of the semiconductor memory device 100 may be performed in the unit of the page. The address ADDR received at the time of a request for the program operation may include the block address, the row address, and the column address. The address decoder 120 may select one memory block and one word line according to the block address and the row address. The column address Yi may be decoded by the address decoder 120 and may be provided to the read and write circuit 130.

The address decoder 120 may include a block decoder, a row decoder, a column decoder, an address buffer, and the like.

The read and write circuit 130 may include a plurality of page buffers PB1 to PBm. The plurality of page buffers PB1 to PBm may be connected to the memory cell array 110 through the bit lines BL1 to BLm. Each of the plurality of page buffers PB1 to PBm may control potentials of the corresponding bit lines BL1 to BLm according to data to be programmed at the time of the program operation. Each of the plurality of page buffers PB1 to BPm may perform the verification operation by sensing the potentials of the corresponding bit lines BL1 to BLm during the verification operation, and then may set a program prohibition mode by adjusting the potentials of the corresponding bit lines BL1 to BLm according to a result of the verification operation.

The read and write circuit 130 may be operated in response to a control by the control logic 140.

In an embodiment, the read and write circuit 130 may include the page buffers (or page registers), a column selection circuit, and the like.

The control logic 140 may be connected to the address decoder 120, the read and write circuit 130, and the voltage generating unit 150. The control logic 140 may receive a command CMD and a control signal CTRL through the input/output buffer (not illustrated) of the semiconductor memory device 100. The control logic 140 may be configured to control a general operation of the semiconductor memory device 100 in response to the command CMD and the control signal CTRL. The control logic 140 may control the address decoder 120, the read and write circuit 130, and the voltage generating unit 150 to perform a program loop alternately and repeatedly performing the program operation and the verification operation. The control logic 140 may control the address decoder 120 and the voltage generating unit 150 so that the pass voltage Vpass applied to the unselected word lines among the plurality of word lines, and the verification voltage Vverify and the program voltage Vpgm applied to the selected word line are continuously applied without being discharged in the section, in which the verification operation is switched to the program operation in the program loop. The control logic 140 may control the address decoder 120 and the voltage generating unit 150 so that the pass voltage Vpass applied to the unselected word lines adjacent to the selected word line among the unselected word lines during the operation of the application of the program voltage is lower than the pass voltage Vpass applied to the remaining unselected word lines.

The voltage generating unit 150 may generate the program voltage Vpgm, the pass voltage Vpass, and the plurality of operation voltages during the program operation, and may generate the verification voltage Vverify, the pass voltage Vpass, and the plurality of operation voltages during the verification operation under the control of the program operation control logic 140. The voltage generating unit 150 may generate the pass voltage generated during the program operation as a first pass voltage and a second pass voltage having a lower potential level than that of the first pass voltage by the control logic 140.

In addition, the voltage generating unit 150 may generate the first pass voltage applied to the unselected word lines as a plurality of voltages having different potential levels during the program operation.

Figure 2:
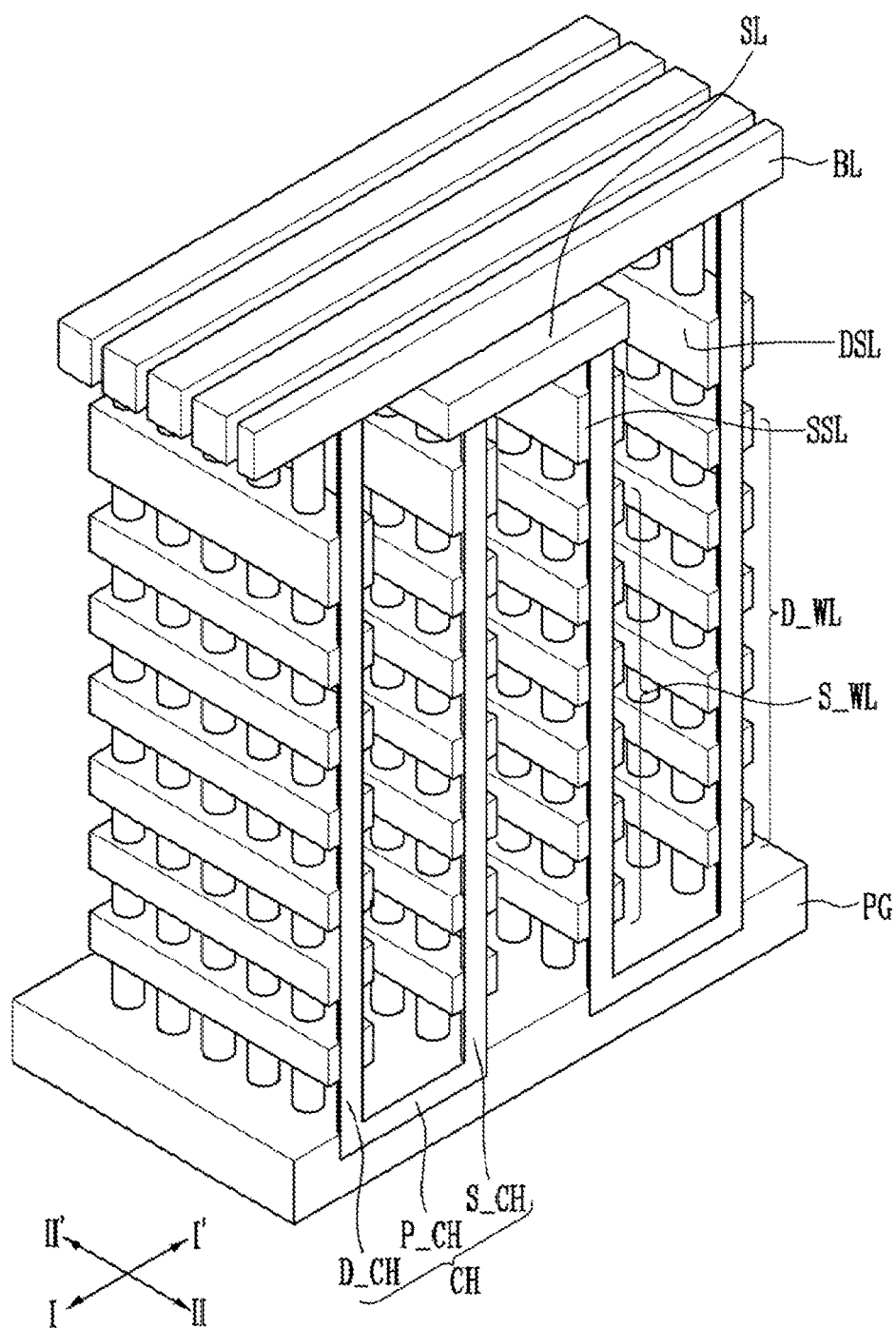
FIG. 2 is a perspective view for describing a representation of an example of a memory cell array of the semiconductor memory device according to an embodiment.

FIG. 2 is a perspective view for describing a representation of an example of a memory cell array of the semiconductor memory device according an embodiment. However, illustration of interlayer insulating layers is omitted for convenience of description.

As illustrated in FIG. 2, the memory cell array may include U-shaped channel layers CH arranged in a first direction I-I' and a second direction II-II' crossing the first direction I-I'. The U-shaped channel layer CH may include a pipe channel layer P_CH formed within a pipe gate PG, and a pair of source side channel layers S_CH and drain side channel layer D_CH connected with the pipe channel layer P_CH.

The semiconductor memory device may include source side word line layers S_WL stacked along the source side channel layer S_CH on the pipe gate PG, and drain side word line layers D_WL stacked along the drain side channel layer D_CH on the pipe gate PG. A source selection line layer SSL is stacked on the source side word lines S_WL, and a drain selection line layer DSL may be stacked on the drain side word line layer D_WL. In this example, dummy word line layers (not illustrated) may be stacked between the drain side word lines D_WL and the drain selection line layer DSL, and the dummy word line layers (not illustrated) may be stacked between the word line layers S_WL and the source selection line layer SSL.

According to the aforementioned structures, the memory cells may be stacked along the U-shaped channel layer CH, the drain selection transistor and the source selection transistor are provided at both ends of the U-shaped channel layer CH, respectively, and the pipe gate PG disposed at the lowermost part of the string in the U-shape may be disposed at a center position of the memory cells and may operate as the pipe transistor.

The semiconductor memory device may include bit line layers BL connected with the drain side channel layer D_CH to be extended in the first direction I-I', and a source line layer SL connected with the source side channel layer S_CH to be extended in the second direction II-II'.

In an example of an embodiment, the structure in which the strings are arranged in the "U" shape is described, but a common source line is formed on a semiconductor substrate, the bit lines are formed on the common source line, and the string having a straight structure is formed between the bit lines and the common source, so that it may be possible to form the semiconductor memory device including the string having a straight structure.

In the strings described above, a channel layer may have an upper width greater than a lower width due to the characteristics of a manufacturing process.

Figure 3:
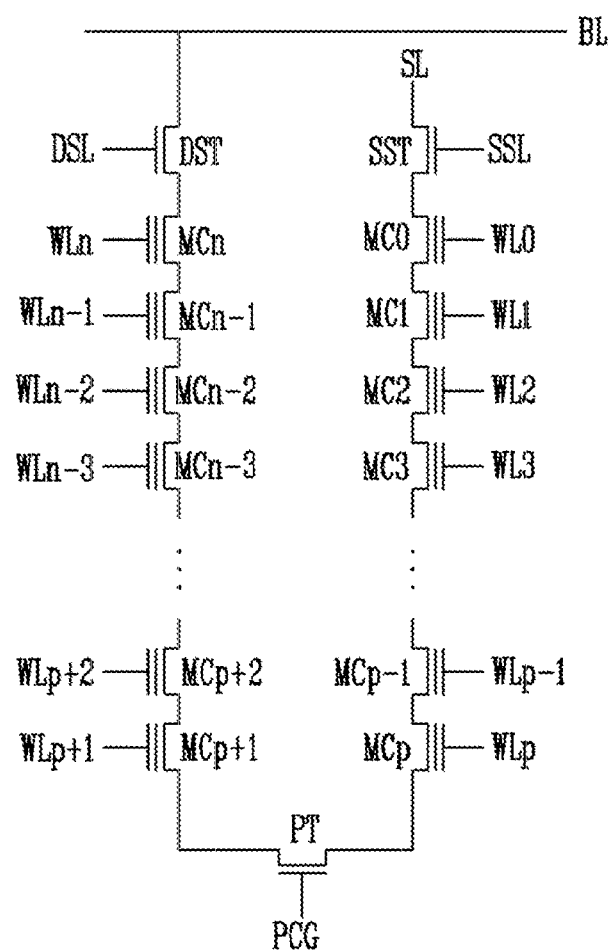
FIG. 3 is a circuit diagram illustrating a representation of an example of a cell string of the semiconductor memory device according to an embodiment.

FIG. 3 is a circuit diagram illustrating a representation of an example of a cell string of the semiconductor memory device according to an embodiment.

Referring to FIG. 3, the cell string String may include the drain selection transistor DST, the plurality of memory cells MC0 to MCn, the pipe transistor PT, and the source selection transistor SST serially connected between the bit line BL and the source line SL. The plurality of memory cells MCp+1 to MCn disposed between the drain selection transistor DST and the pipe transistor PT among the plurality of memory cells MC0 to MCn may be defined as the drain side memory cells. The plurality of memory cells MC0 to MCp disposed between the source selection transistor SST and the pipe transistor PT among the plurality of memory cells MC0 to MCn may be defined as the source side memory cells. The memory cells more adjacent to the drain selection transistor DST than the source selection transistor SST among the plurality of memory cells serially connected between the drain selection transistor DST and the source selection transistor SST may be defined as the drain side memory cells, and the memory cells more adjacent to the source selection transistor SST than the drain selection transistor DST may be defined as the source side memory cells.

A gate of the drain selection transistor DST is connected to the drain selection line DSL. A gate of the source selection transistor SST is connected with the source selection line SSL. Gates of the plurality of memory cells MC0 to MCn are connected to the plurality of word lines WL0 to WLn, respectively. A gate of the pipe transistor PT is connected to a pipe transistor gate line so that a pipe transistor operation voltage PCG generated by the voltage generating unit 150 of FIG. 1 may be received.

In an embodiment, an embodiment has been described based on the semiconductor memory device, in which the memory cell array is formed in a 3D structure, as an example, but the embodiments are not limited thereto, and is the various embodiments are applicable to a semiconductor memory device having a 2D structure, in which a memory cell array is two-dimensionally disposed on the semiconductor substrate.

Figure 4:
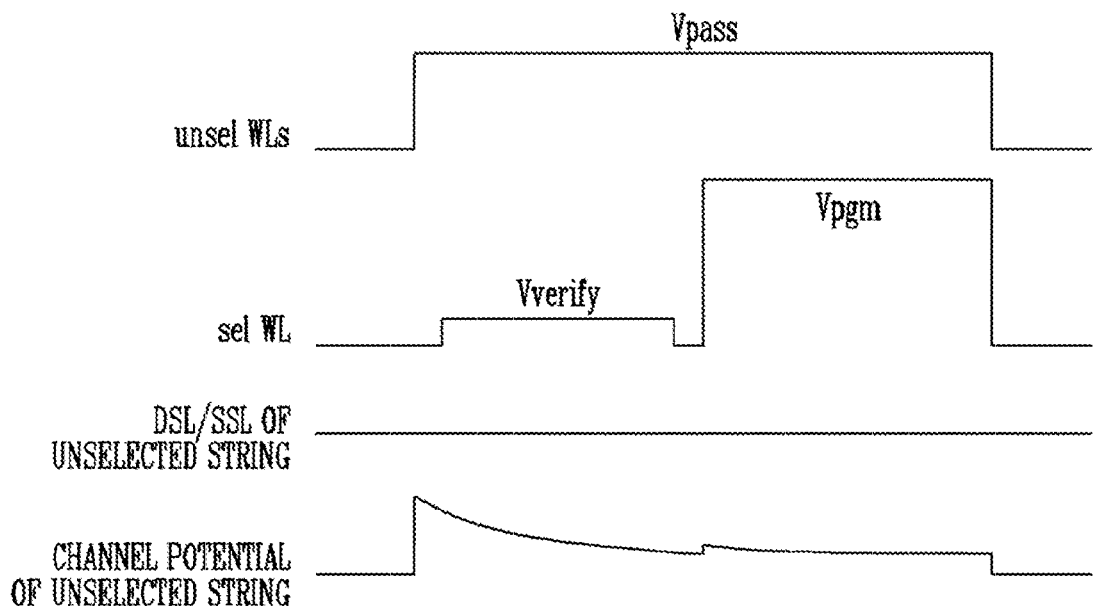
FIG. 4 is a waveform diagram of a representation of an example of signals for describing program and verification operations of a semiconductor memory device.

FIG. 4 is a waveform diagram of a representation of an example of signals for describing program and verification operations of a semiconductor memory device.

The program and verification operations of the semiconductor memory device will be described with reference to FIGS. 1, 3, and 4.

The program loop alternately and repeatedly performing the program operation and the verification operation applies the pass voltage Vpass to the unselected word lines unsel WLs and the verification voltage Vverify to the selected word line sel WL during the verification operation. Accordingly, a channel potential of the unselected string is boosted to a high level by the pass voltage Vpass applied to the unselected word lines unsel WLs. In this case, the operation voltage is applied to the drain selection line DSL and the source selection line SSL of the unselected string, so that the drain selection transistor DST and the source selection transistor SST are in a turned-on state.

When the program operation is performed after the verification operation, the pass voltage Vpass is continuously applied to the unselected word lines unsel WLs, and the verification voltage Vverify is discharged to a low level in the selected word line sel WL, and then the program voltage Vpgm is applied to the selected word line sel WL. When the program operation is performed after the verification operation, the verification voltage Vverify applied to the selected word line sel WL is discharged to a low level, and in this case, leakage current may be generated by the drain selection transistor DST and the source selection transistor SST in the turned-on state, so that the channel potential of the unselected string may be sharply discharged, and thus a program disturbance phenomenon of the unselected string may be generated during a subsequent program operation. The phenomenon is equally generated in an operation of discharging the program voltage Vpgm before the verification voltage Vverify is applied in the section, in which the program operation is switched to the verification operation, thereby causing a read disturbance phenomenon during the verification operation.

Figure 5:
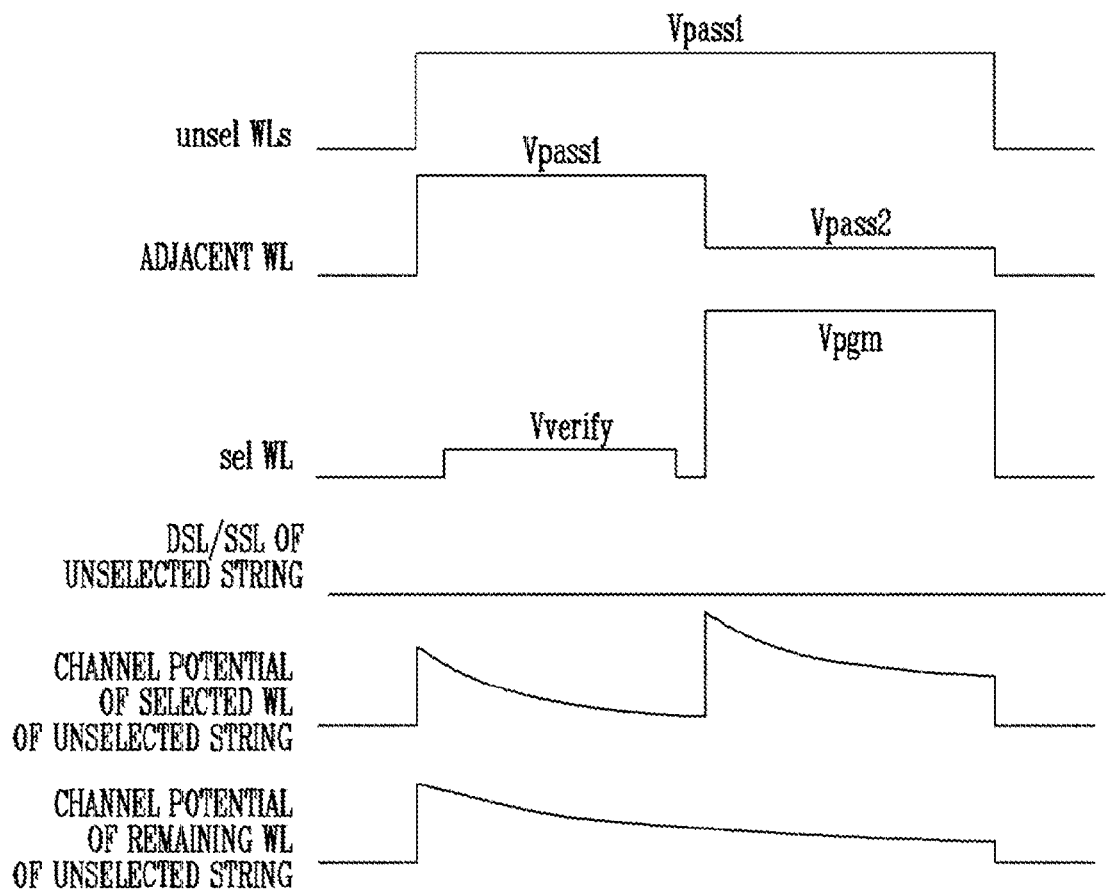
FIG. 5 is a waveform diagram of representations of examples of signals for describing program and verification operations of a semiconductor memory device according to an embodiment.

FIG. 5 is a waveform diagram of representations of examples of signals for describing the program and verification operations of a semiconductor memory device according to an embodiment.

The program loop alternately and repeatedly performing the program operation and the verification operation applies a first pass voltage Vpass1 to the unselected word lines unsel WLs and the verification voltage Vverify to the selected word line sel WL during the verification operation. In this case, a ground voltage is applied to the drain selection line DSL and the source selection line SSL of the unselected string, so that the drain selection transistor DST and the source selection transistor SST are in a turned-off state, and a channel potential of the unselected string is boosted to a high level by the first pass voltage Vpass1 applied to the unselected word lines unsel WLs.

When the program operation is performed after the verification operation, a second pass voltage Vpass2 lower than the first pass voltage Vpass1 is applied to the word lines adjacent to the unselected word line among the unselected word lines, and the first pass voltage Vpass1 is continuously applied to the remaining unselected word lines unsel WLs without having the discharge section. In this case, the verification voltage Vverify is discharged to a low level and then the program voltage Vpgm is applied to the selected word line sel WL.

When the verification operation is switched to the program operation, and the verification voltage Vverify applied to the unselected word line sel WL is discharged a low level, the second pass voltage Vpass2 lower than the first pass voltage Vpass 1 is applied to the unselected word lines adjacent to the selected word line. The drain selection transistor DST and the source selection transistor SST are in the turned-off state, and the second pass voltage Vpass2 lower than the first pass voltage Vpass 1 is applied to the unselected word lines adjacent to the selected word line, so that a channel potential level of the unselected string may be suppressed from being decreased by leakage current. The leakage current generated through the source line and the bit line is blocked by the drain selection transistor DST and the source selection transistor SST, which are in the turned-off state, a difference between a gate voltage and a source voltage of the unselected memory cell adjacent to the selected word line of the unselected string, which is boosted and has a positive potential level, is smaller than a threshold voltage of the memory cell, so that the memory cell is turned off regardless of the program state of the memory cell, so that a channel region is electrically separated from another channel region based on the selected word line, so that leakage current is blocked. Further, an additional channel boosting phenomenon is generated by the program voltage applied to the selected word line in the unselected string during the program operation, so that the program operation is not performed.

The unselected word line adjacent to the selected word line may be set as the first to fifth adjacent word lines adjacent in both directions based on the selected word line, and may be changed.

According to an example of an embodiment, the pass voltage applied to the unselected word lines may be continuously applied without the discharge section during the program operation and the verification operation, so that power consumption may be improved, and a potential level of the unselected channel may be suppressed from being decreased by decreasing leakage current by turning off the drain selection transistor and the source selection transistor, and the pass voltage applied to the unselected word lines adjacent to the selected word line may be decreased to be lower than the pass voltage applied to the remaining unselected word lines and applied, so that a non-channel may be electrically separated and thus the channel boosting effect may be maximized to solve a program disturbance phenomenon of the unselected string. Further, a performance time of the program loop may be decreased by skipping the discharge section. Further, power consumption may be decreased by skipping the discharge section.

In an example of an embodiment, only the section, in which the program operation is performed after the verification operation, has been described, but the embodiments may be equally applied to even in a section, in which the verification operation is performed after the program operation, to improve the read disturbance phenomenon during the verification operation. For example, the second pass voltage Vpass2 is applied to the unselected word lines adjacent to the selected word lines among the unselected word lines, and the first pass voltage Vpass1 is applied to the remaining unselected word lines during the program operation. Then, the first pass voltage Vpass1 is immediately applied to the unselected word lines adjacent to the selected word lines without the discharge section, and the first pass voltage Vpass1 is maintained in the remaining unselected word lines in the section, in which the program operation is changed to the verification operation.

FIG. 6 is a waveform diagram of representations of examples of signals for describing program and verification operations of a semiconductor memory device according to an embodiment.

The program loop alternately and repeatedly performing the program operation and the verification operation applies a first pass voltage Vpass1 to the unselected word lines unsel WLs and the verification voltage Vverify to the selected word line sel WL during the verification operation. In this case, a ground voltage is applied to the drain selection line DSL and the source selection line SSL of the unselected string, so that the drain selection transistor DST and the source selection transistor SST are in a turned-off state, and a channel potential of the unselected string is boosted to a high level by the first pass voltage Vpass1 applied to the unselected word lines unsel WLs.

When the program operation is performed after the verification operation, a second pass voltage Vpass2 lower than the first pass voltage Vpass1 is applied to the word lines adjacent to the selected word line among the unselected word lines, and the first pass voltage Vpass1 is continuously applied to the remaining unselected word lines unsel WLs without the discharge section. In this case, the verification voltage Vverify is applied to the selected word line sel WL and then the program voltage Vpgm is applied to the selected word line sel WL without the discharge section. Accordingly, an operation time may be decreased as much as the discharge section, and a channel potential level may be further increased by immediately applying the program voltage Vpgm without the discharge section.

When the verification operation is switched to the program operation, the second pass voltage Vpass2 lower than the first pass voltage Vpass1 is applied to the unselected word lines adjacent to the selected word line. The drain selection transistor DST and the source selection transistor SST are in the turned-off state, and the second pass voltage Vpass2 lower than the first pass voltage Vpass1 is applied to the unselected word lines adjacent to the selected word line, so that a channel potential level of the unselected string may be suppressed from being decreased by leakage current. Further, the channel region is separated from another channel region based on the selected word line, so that the leakage current is blocked.

The unselected word line adjacent to the selected word line may be the first to fifth adjacent word lines adjacent in both directions based on the selected word line, and may be changed.

According to an example of an embodiment, the pass voltage applied to the unselected word lines are continuously applied without the discharge section during the program operation and the verification operation, and the verification voltage and the program voltage are continuously applied to the selected word line without the discharge section, so that power consumption may be improved, and a potential level of the unselected channel may be suppressed from being decreased by decreasing leakage current by turning off the drain selection transistor and the source selection transistor. Further, the pass voltage applied to the unselected word lines adjacent to the selected word line is decreased to be lower than the pass voltage applied to the remaining unselected word lines and applied, so that a channel boosting effect may be maximized by electrically separating a non-channel, and thus a program disturbance phenomenon of the unselected string may be improved.

In an example of an embodiment, only the section, in which the program operation is performed after the verification operation, has been described, but the embodiments may be equally applied to even in a section, in which the verification operation is performed after the program operation, to improve the read disturbance phenomenon during the verification operation. For example, the second pass voltage Vpass2 is applied to the unselected word lines adjacent to the selected word lines among the unselected word lines, and the first pass voltage Vpass1 is applied to the remaining unselected word lines during the program operation. Then, the first pass voltage Vpass1 is directly applied to the unselected word lines adjacent to the selected word lines without the discharge section, and the first pass voltage Vpass1 is maintained in the remaining unselected word lines in the section, in which the program operation is changed to the verification operation. Further, after the program voltage Vpgm is applied to the selected word line during the program operation, the verification voltage Vverify is immediately applied without the discharge section of the selected word line in the section, in which the program operation is changed to the verification operation, so that an entire time of the program loop may be decreased.

Figure 7A:
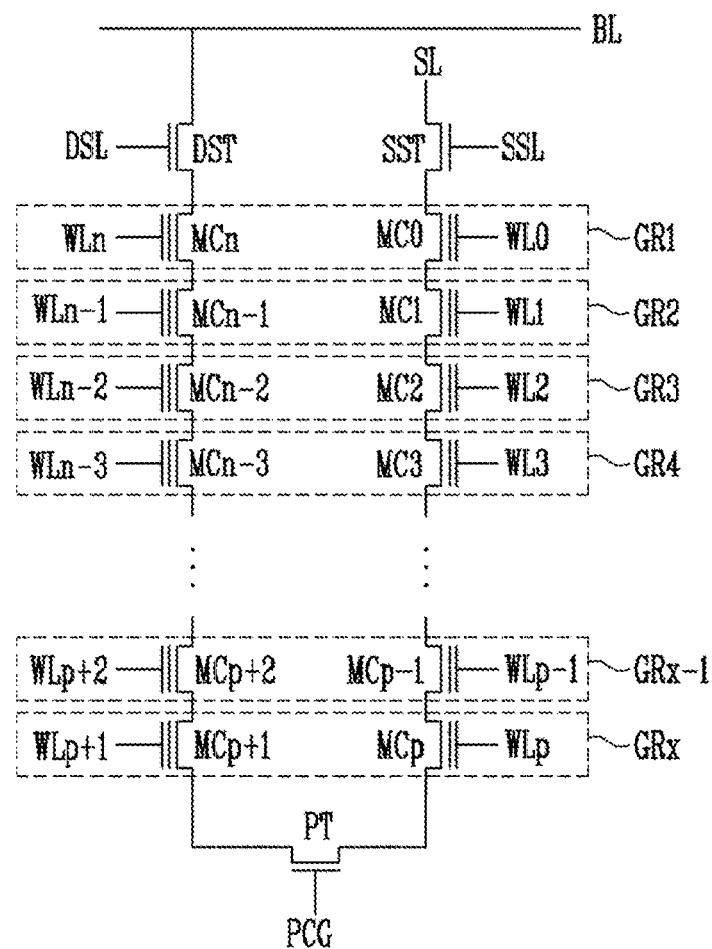
FIGS. 7A and 7B are diagrams describing grouping word lines during the program and verification operations of the semiconductor memory device according to an embodiment.
Figure 7B:
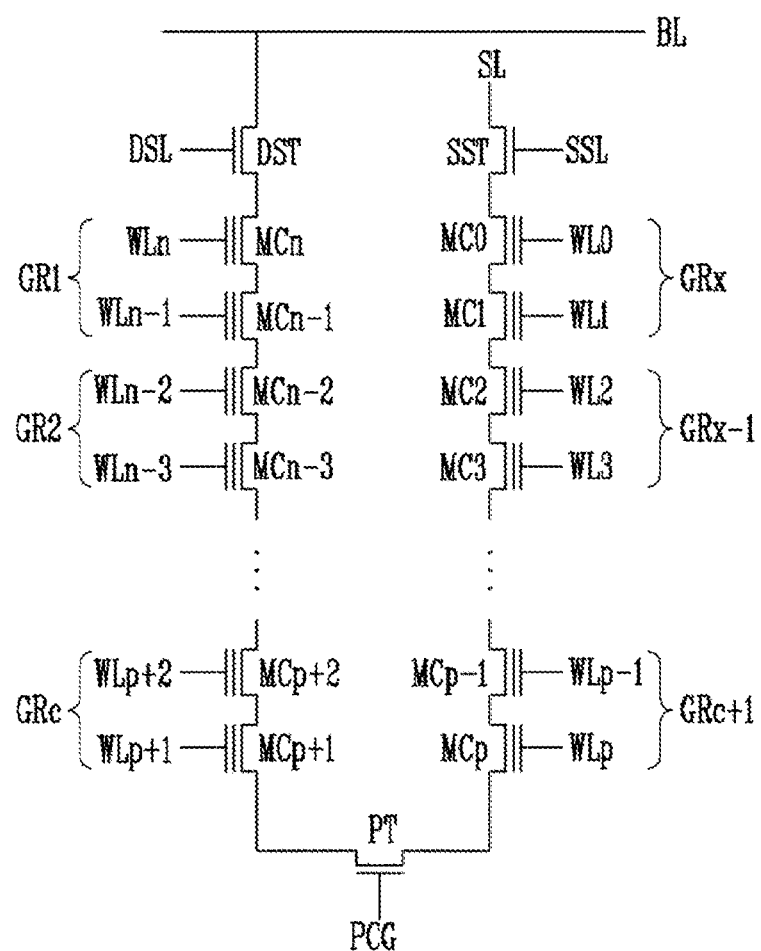

FIGS. 7A and 7B are diagrams describing grouping word lines during the program and verification operations of the semiconductor memory device according to an embodiment.

Referring to FIG. 7A, the plurality of word lines WL0 to WLn may be grouped into a plurality of groups GR1 to GRx in accordance with arrangement positions. For example, the word lines WL0 and WLn disposed away from the semiconductor substrate may be defined as a first group, and word lines WLp and WLp+1 disposed close to the semiconductor substrate may be defined as an xth group. In an embodiment, two word lines disposed at the similar distance with each other from the semiconductor substrate is defined as one group, but the present invention is not limited thereto. Two or more word lines adjacent to one another may be defined as one group.

Referring to FIG. 7B, the plurality of word lines WL0 to WLn may be grouped into the plurality of groups GR1 to GRx according to a program sequence. For example, when the semiconductor memory device sequentially performs the program operations on a page basis to program from the memory cell MC0 adjacent to the source selection transistor SST to the memory cells MCn adjacent to the drain selection transistor DST, memory cell MCn to MCn−1 programmed late in the program sequence may be defined as the first group and the memory cells MC0 and MC1 programmed early in the program sequence may be defined as the xth group. In an embodiment, two word lines are defined as one group according to the program sequence, but the present invention is not limited thereto. That is, one or more word lines may be defined as one group.

FIG. 8 is a waveform diagram of representations of examples of signals for describing program and verification operations of a semiconductor memory device according to another embodiment.

The program loop alternately and repeatedly performing the program operation and the verification operation may apply a plurality of first pass voltages Vpass1_1 to Vpass1_x having different potential levels to the unselected word lines unsel WLs and the verification voltage Vverify to the selected word line sel WL during the verification operation, so that the verification operation may be performed. The plurality of first pass voltages Vpass1_1 to Vpass1_x applied to the unselected word lines unsel WLs, respectively, may be adjusted in accordance with arrangement positions or program sequences of the word lines. For example, a relatively low first pass voltage may be applied to the unselected word line of the unselected word lines unsel WLs that is disposed away from the semiconductor substrate, and a relatively high first pass voltage may be applied to the unselected word line of the unselected word lines unsel WLs that is disposed closer to the semiconductor substrate.

Alternatively, the relatively high first pass voltage may be applied to word lines coupled to the memory cells programmed early in the program sequence, and the relatively low first pass voltage may be applied to word line coupled to the memory cells programmed late in the program sequence. That is, as shown in FIG. 7A or FIG. 7B, when the word lines are divided into the plurality of groups GR1 to GRx to define, the first pass voltage Vpass1_1 that is relatively low may be applied to the first group GR1, and the first pass voltage Vpass1_x that is the highest may be applied to the xth group GRx by increasing the first pass voltage for each group.

The first pass voltage Vpass 1 applied to word lines adjacent to the selected word line sel WL may be one of the plurality of first pass voltages Vpass1_1 to Vpass1_x.

Referring to FIG. 7A, the first pass voltage Vpass1_X having the highest potential level may be applied to word lines WLn and WL0, and the first pass voltage Vpass1_1 having the lowest potential level may be applied to word lines WLp+1 and WLp, so that potential levels of the first pass voltage in accordance with channel widths of memory cells corresponding to arrangement positions of the word lines may be adjusted. Thus, although the channel widths of the plurality of memory cells MC0 to MCn are different according to the arrangement positions thereof, the current amounts flowing through the memory cells may be uniformly adjusted in accordance with the different potential levels of the first pass voltage during the program verification operation.

Referring to FIG. 7B, the program operation of the memory cells, which are programmed early in the program sequence, may be completed to be the program state. As a result, the threshold voltage of the memory cell may be high, and the amount of currents flowing through the memory cell during the program verification operation may be uniformly controlled by applying the relatively high first pass voltage to the memory cell.

A ground voltage may be applied to the drain selection line DSL and the source selection line SSL of the unselected string, so that the drain selection transistor DST and the source selection transistor SST may be in a turned-off state, and a channel potential of the unselected string may be boosted to a high level by the first pass voltages Vpass1 to Vpass1_x applied to the unselected word lines unsel WLs.

When the program operation is performed after the verification operation, a second pass voltage Vpass2 lower than the first pass voltage Vpass1 may be applied to the word lines adjacent to the selected word line among the unselected word lines, and the first pass voltages Vpass1_1 to Vpass1_x may be continuously applied to the remaining unselected word lines unsel WLs without having the discharge section. In this case, the program voltage Vpgm may be applied to the selected word line sel WL after discharging the verification voltage Vverify to a ground voltage level, or without discharging the verification voltage Vverify. The drain selection transistor DST and the source selection transistor SST may be in the turned-off state, and the second pass voltage Vpass2 lower than the first pass voltage Vpass 1 may be applied to the unselected word lines adjacent to the selected word line, so that a channel potential level of the unselected string may be suppressed from being decreased by leakage current. The second pass voltage Vpass2 may be lower than the first voltage Vpass1_1 having the lowest potential level, among the plurality of first pass voltages Vpass1_1 to Vpass1_x. The leakage current generated through the source line and the bit line may be blocked by the drain selection transistor DST and the source selection transistor SST, which are in the turned-off state, a difference between a gate voltage and a source voltage of the unselected memory cell adjacent to the selected word line of the unselected string, which is boosted and has a positive potential level, is smaller than a threshold voltage of the memory cell, so that the memory cell is turned off regardless of the program state of the memory cell, so that a channel region is electrically separated from another channel region based on the selected word line, so that leakage current is blocked. Further, an additional channel boosting phenomenon is generated by the program voltage applied to the selected word line in the unselected string during the program operation, so that the program operation is not performed.

The unselected word lines adjacent to the selected word line may be set as the first to fifth adjacent word lines adjacent in both directions based on the selected word line, and may be changed.

According to an example of an embodiment, the first pass voltages applied to the unselected word lines may be adjusted according to the arrangement positions or the program sequences of the word lines so that the amount of cell current is uniform, thereby improving the accuracy of the verify operation. The pass voltage applied to the unselected word lines may be continuously applied without the discharge section during the program operation and the verification operation, so that power consumption may be improved, and a potential level of the unselected channel may be suppressed from being decreased by decreasing leakage current by turning off the drain selection transistor and the source selection transistor, and the pass voltage applied to the unselected word lines adjacent to the selected word line may be decreased to be lower than the pass voltage applied to the remaining unselected word lines and applied, so that a non-channel may be electrically separated and thus the channel boosting effect may be maximized to solve a program disturbance phenomenon of the unselected string. Further, a performance time of the program loop may be decreased by skipping the discharge section. Further, power consumption may be decreased by skipping the discharge section.

Figure 9:
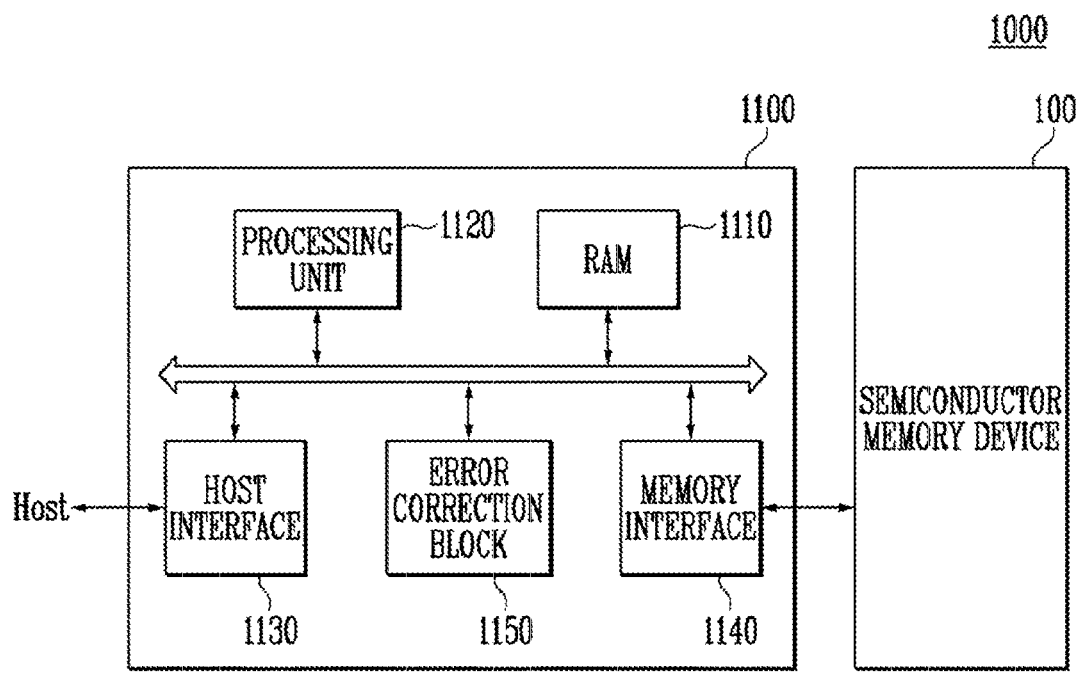
FIG. 9 is a block diagram illustrating a representation of an example of a memory system including a semiconductor memory device of FIG. 1.

FIG. 9 is a block diagram illustrating a representation of an example of a memory system including a semiconductor memory device of FIG. 1.

Referring to FIG. 9, a memory system 1000 may include a semiconductor memory device 100 and a controller 1100.

The semiconductor memory device 100 may be configured and operated in a similar manner to that described with reference to FIG. 1. Hereinafter, overlapping descriptions will be omitted.

The controller 1100 is connected to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the semiconductor memory device 100 and the host Host. The controller 1100 is configured to drive firmware for controlling the semiconductor memory device 100.

The controller 1100 may include a Random Access Memory (RAM) 1110, a processing unit 1120, a host interface 1130, a memory interface 1140, and an error correction block 1150. The RAM 1110 is used as at least one among an operation memory of the processing unit 1120, a cache memory between the semiconductor memory device 100 and the host Host, and a buffer memory between the semiconductor memory device 100 and the host Host. The processing unit 1120 controls a general operation of the controller 1100. Further, the controller 1100 may temporarily store program data provided from the host Host during the write operation.

The host interface 1130 may include a protocol for performing a data exchange between the host Host and the controller 1100. In an example of an embodiment, the controller 1200 is configured to communicate with the host through at least one of various interface protocols, such as a Universal Serial Bus (USB) protocol, a Multimedia Card (MMC) protocol, a Peripheral Component Interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol, and a private protocol.

The memory interface 1140 interfaces with the semiconductor memory device 100. For example, the memory interface may include a NAND interface or a NOR interface.

The error correction block 1150 is configured to detect and correct an error of data received from the semiconductor memory device 100 by using an Error Correction Code (ECC). The processing unit 1120 may control the semiconductor memory device 100 to adjust a read voltage according to a result of the error detection of the error correction block 1150 and perform a re-read operation. In an example of an embodiment, the error correction block may be provided as a constituent element of the controller 1100.

The controller 1100 and the semiconductor memory device 100 may be integrated into one semiconductor device. In an example of an embodiment, the controller 1100 and the semiconductor memory device 100 may be integrated into one semiconductor device to configure a memory card. For example, the controller 1100 and the nonvolatile memory device 100 may be integrated as one semiconductor device to configure a memory card, such as a PC card (Personal Computer Memory Card International Association (PCMCIA)), a Compact Flash (CF) card, Smart Media Cards (SM, SMC), a memory stick, multimedia cards (MMC, RS-MMC, and MMCmicro), SD cards (SD, miniSD, microSD, and SDHC), and a Universal Flash Storage (UFS).

The controller 1100 and the semiconductor memory device 100 may be integrated into one semiconductor device to configure a semiconductor drive (Solid State Drive (SSD)). The semiconductor drive (SSD) may include a storage device configured to store data in a semiconductor memory. In a case where the memory system 1000 is used as the SSD, an operation speed of the host Host connected to the memory system 1000 may be remarkably improved.

In an example, the memory system 1000 may be provided as one of various constituent elements of an electronic device, such as a computer, an ultra-mobile PC (UMPC, a workstation, a net-book computer, personal digital assistants (PDA), a portable computer, a web tablet PC, a wireless phone, a mobile phone, a smart phone, an e-book reader, a portable multimedia player (PMP), a portable game device, a navigation device, a black box, a digital camera, a 3-dimensional television, a digital audio recorder, a digital audio player, a digital picture recorder, a digital picture player, a digital video recorder, a digital video player, a device capable transceiving information in a wireless environment, one of various electronic devices configuring a home network, one of various electronic devices configuring a computer network, one of various electronic devices configuring a telematics network, an RFID device, or one of various constituent elements devices configuring a computing system.

In an example of an embodiment, the semiconductor memory device 100 or the memory system 1000 may be mounted in various types of packages. For example, the semiconductor memory device 100 or the memory system 2000 may be packaged and mounted by a method, such as Package on Package (PoP), Ball Grid Arrays (BGAs), Chip Scale Packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flat pack (TQFP), Small Outline (SOIC), Shrink Small Outline Package (SSOP), Thin Small Outline (TSOP), Thin Quad Flat pack (TQFP), System In Package (SIP), Multi Chip Package (MCP), Wafer-level Fabricated Package (WFP), and Wafer-Level Processed Stack Package (WSP).

Figure 10:
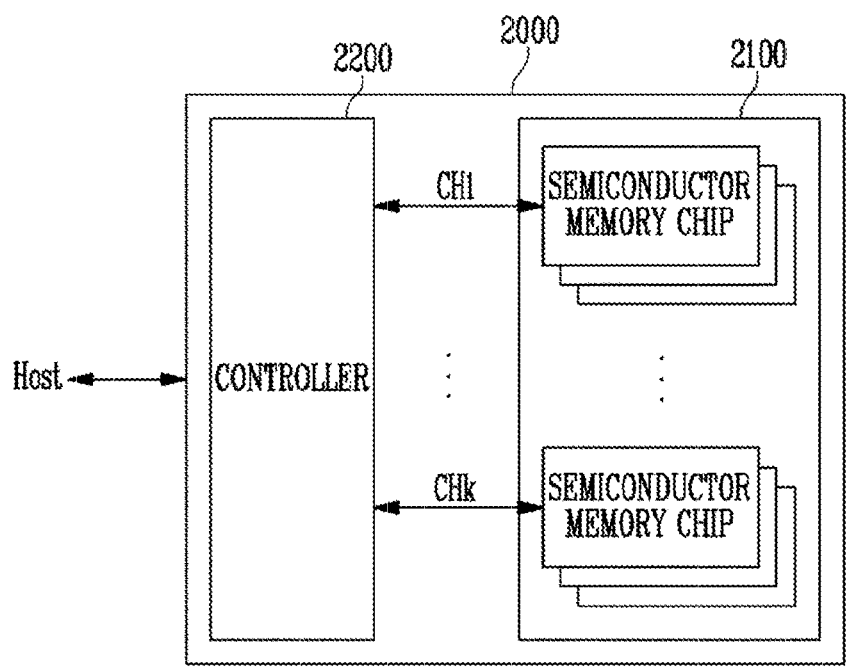
FIG. 10 is a block diagram illustrating a representation of an application example of a memory system of FIG. 9.

FIG. 10 is a block diagram illustrating a representation of an application example of a memory system of FIG. 9.

Referring to FIG. 10, a memory system 2000 may include a semiconductor memory device 2100 and a controller 2200. The semiconductor memory device 2100 may include a plurality of semiconductor memory chips. The plurality of semiconductor memory chips may be divided into a plurality of groups.

Referring to FIG. 10, it is illustrated that the plurality of groups communicates with the controller 2200 through first to $k^{th}$ channels CH1 to CHk, respectively. Each semiconductor memory chip may be configured and operate in a similar manner to that of the semiconductor memory devices 100 described with reference to FIG. 1.

Each group may be configured to communicate with the controller 2200 through one common channel. The controller 2200 may be configured in a similar manner to the controller 2100 described with reference to FIG. 9, and may be configured to control the plurality of memory chips of the semiconductor memory device 2100 through the plurality of channels CH1 to CHk.

Figure 11:
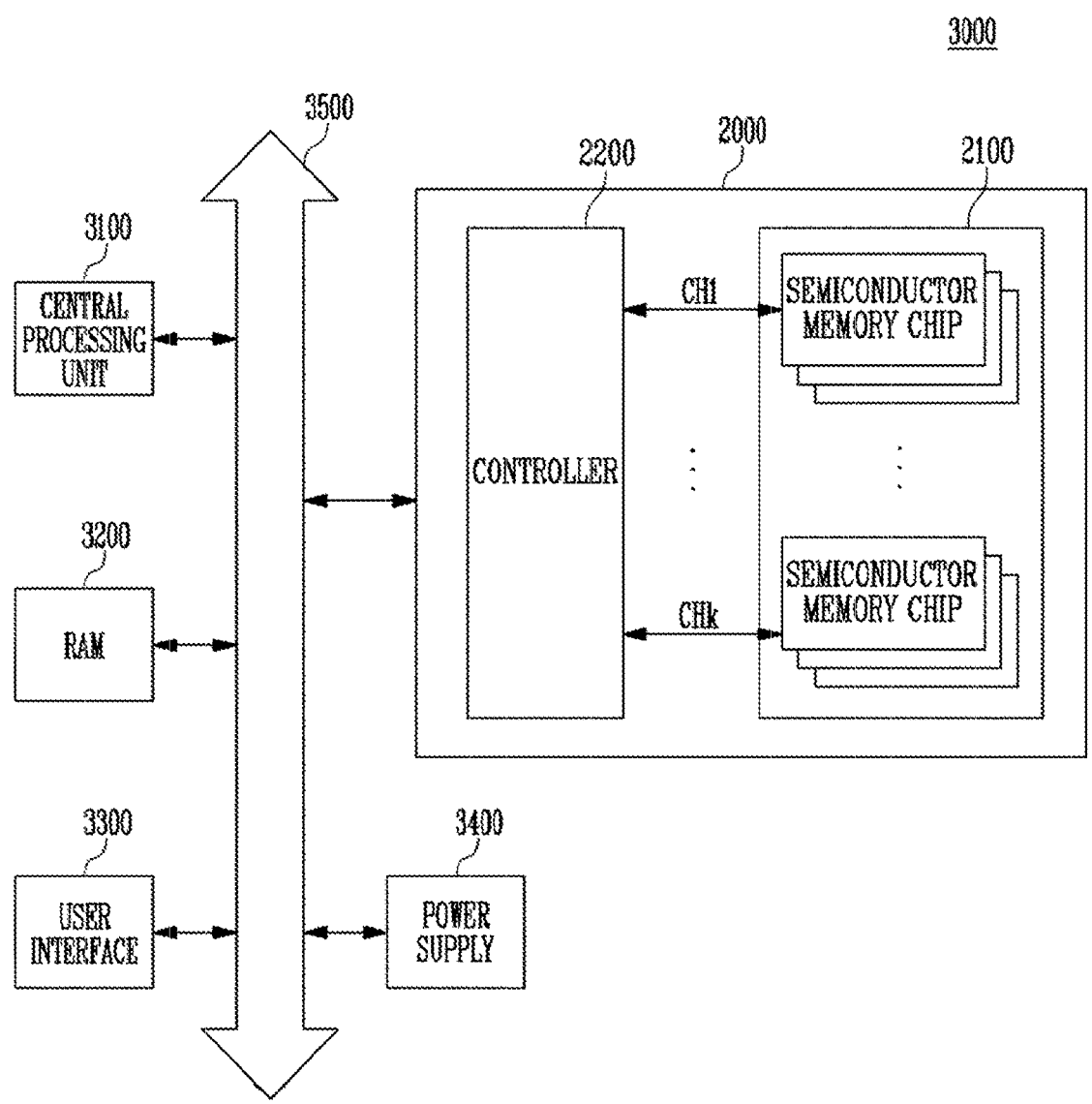
FIG. 11 is a block diagram illustrating a representation of an example of a computing system including a memory system described with reference to FIG. 10.

FIG. 11 is a block diagram illustrating a representation of an example of a computing system including a memory system described with reference to FIG. 10.

Referring to FIG. 11, a computing system 3000 may include a central processing unit 3100, a Random Access Memory (RAM) 3200, a user interface 3300, a power supply 3400, a system bus 3500, and the memory system 2000.

The memory system 2000 is electrically connected to the central processing unit 3100, the RAM 3200, the user interface 3300, and the power supply 3400 through the system bus 3500. Data provided through the user interface 3300 or processed by the central processing unit 3100 is stored in the memory system 2000.

In FIG. 11, it is illustrated that the semiconductor memory device 2100 is connected to the system bus 3500 through the controller 2200. However, the semiconductor memory device 2100 may be configured to be directly connected to the system bus 3500. In this case, a function of the controller 2200 may be performed by the central processing unit 3100 and the RAM 3200.

In FIG. 11, it is illustrated that the memory system 2000 described with reference to FIG. 10 is provided. However, the memory system 2000 may be substituted with the memory system 1000 described with reference to FIG. 9. In an example of an embodiment, the computing system 3000 may be configured to include all of the memory systems 2000 and 1000 described with reference to FIGS. 10 and 9.

As described above, the embodiments have been disclosed in the drawings and the specification. The specific terms used herein are for purposes of illustration, and do not limit the scope of the application defined in the claims. Accordingly, those skilled in the art will appreciate that various modifications and another equivalent example may be made without departing from the scope and spirit of the present disclosure.

What is claimed is:

1. A semiconductor memory device, comprising:
    a memory cell array including a plurality of cell strings;
    a peripheral circuit unit configured to perform a program loop for alternately performing a program operation and a verification operation on the memory cell array; and
    a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation,
    wherein the plurality of word lines are defined as a plurality of groups, and the first pass voltages applied to the plurality of groups, respectively, are different from one another,
    wherein the plurality of word lines are grouped into the plurality of groups in accordance with channel widths of corresponding memory cells.

2. The semiconductor memory device of claim 1, wherein the control logic controls the voltage generation unit to turn off a drain selection transistor and a source selection transistor included in an unselected cell string among the plurality of cell strings while the program loop is performed.

3. The semiconductor memory device of claim 1, wherein the control logic controls the peripheral circuit unit so that the first pass voltage is changed to the second pass voltage and the second pass voltage is applied to the adjacent unselected word line in a section, in which the verification operation is switched to the program operation in the program loop, in such a manner that the first pass voltage and the second pass voltage are continuously applied.

4. The semiconductor memory device of claim 1, wherein the control logic controls the peripheral circuit unit to continuously apply the first pass voltage to the remaining unselected word line while the verification operation is switched to the program operation in the program loop.

5. The semiconductor memory device of claim 1, wherein the control logic controls the peripheral circuit unit so that the second pass voltage is changed to the first pass voltage and the first pass voltage is applied to the adjacent unselected word line in a section, in which the program operation is switched to the verification operation in the program loop, in such a manner that the second pass voltage and the first pass voltage are continuously applied.

6. The semiconductor memory device of claim 1, wherein the control logic controls the peripheral circuit unit to continuously apply the first pass voltage to the remaining unselected word line while the program operation is switched to the verification operation in the program loop.

7. The semiconductor memory device of claim 1, wherein the control logic controls the peripheral circuit unit so that a verification voltage is applied to the selected word line during the verification operation and a program voltage is applied to the selected word line during the program operation, in such a manner that a section, in which the selected word line is discharged, is included in a section between the operation of applying the verification voltage and the operation of applying the program voltage.

8. The semiconductor memory device of claim 1, wherein the control logic controls the peripheral circuit unit so that a verification voltage is applied to the selected word line during the verification operation and a program voltage is applied to the selected word line during the program operation, in such a manner that the operation of applying the verification voltage and the operation of applying the program voltage are continuously performed.

9. The semiconductor memory device of claim 1, wherein the first pass voltage applied to a group including word lines corresponding to memory cells having relatively narrow channel widths, among the plurality of groups, has a higher potential level than the first pass voltage applied to a group including word lines corresponding to memory cells having relatively wide channel widths.

10. A semiconductor memory device, comprising:
a memory cell array including a plurality of cell strings;
a peripheral circuit unit configured to perform a program loop for alternately performing a program operation and a verification operation on the memory cell array; and
a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation,
wherein the plurality of word lines are grouped into a plurality of groups in accordance with arrangement positions,
wherein the first pass voltage applied to a group including word lines relatively close to a semiconductor substrate, among the plurality of groups, has a higher potential level than the first pass voltage applied to a group including word lines relatively away from the semiconductor substrate.

11. A semiconductor memory device, comprising:
a memory cell array including a plurality of cell strings;
a peripheral circuit unit configured to perform a program loop for alternately performing a program operation and a verification operation on the memory cell array; and
a control logic configured to control the peripheral circuit unit to perform the program loop, wherein, in performing the program loop, a second pass voltage applied to unselected word lines adjacent to a selected word line among a plurality of word lines coupled to the memory cell array is lower than a first pass voltage applied to remaining unselected word lines during the program operation,
wherein the plurality of word lines are grouped into a plurality of groups in accordance with program sequences of corresponding memory cells.

12. The semiconductor memory device of claim 11, wherein the first pass voltage applied to a group including word lines coupled to memory cells programmed early in a program sequence, among the plurality of groups, has a higher potential level than the first pass voltage applied to a group including word lines coupled to memory cells programmed late in the program sequence.

* * * * *